United States Patent
Mei

(10) Patent No.: US 9,553,219 B2
(45) Date of Patent: Jan. 24, 2017

(54) GLASS UNIT

(71) Applicant: Aaron Mei, Taichung (TW)

(72) Inventor: Aaron Mei, Taichung (TW)

(73) Assignee: APA Solutions Holdings, LLC, Riviera Beach, FL (US)

( * ) Notice: Subject to any disclaimer, the term of this patent is extended or adjusted under 35 U.S.C. 154(b) by 0 days.

(21) Appl. No.: 15/130,462

(22) Filed: Apr. 15, 2016

(65) Prior Publication Data

US 2016/0293782 A1  Oct. 6, 2016

Related U.S. Application Data

(63) Continuation of application No. 13/494,032, filed on Jun. 12, 2012, which is a continuation-in-part of application No. 12/456,529, filed on Jun. 17, 2009, now abandoned.

(51) Int. Cl.
| | |
|---|---|
| *H01L 31/0236* | (2006.01) |
| *H01L 31/048* | (2014.01) |
| *H01L 31/054* | (2014.01) |
| *H01L 31/055* | (2014.01) |
| *H02S 40/38* | (2014.01) |
| *B82Y 30/00* | (2011.01) |

(52) U.S. Cl.
CPC ......... *H01L 31/02366* (2013.01); *B82Y 30/00* (2013.01); *H01L 31/048* (2013.01); *H01L 31/0488* (2013.01); *H01L 31/055* (2013.01); *H01L 31/0547* (2014.12); *H02S 40/38* (2014.12); *Y02E 10/52* (2013.01)

(58) Field of Classification Search
CPC ................... H01L 31/02322; H01L 31/02325; H01L 31/048–31/0488
USPC ..................... 136/243–265; 359/883; 74/116
See application file for complete search history.

(56) References Cited

U.S. PATENT DOCUMENTS

| | | | | |
|---|---|---|---|---|
| 4,149,902 A * | 4/1979 | Mauer | ................... | H01L 31/055 126/648 |
| 4,186,033 A * | 1/1980 | Boling | ..................... | F24J 2/265 126/634 |
| 2004/0095658 A1* | 5/2004 | Buretea | .................. | B82Y 20/00 359/853 |
| 2008/0245411 A1* | 10/2008 | Hammermann | .......... | C09B 5/62 136/256 |

* cited by examiner

*Primary Examiner* — Eric R Smith
(74) *Attorney, Agent, or Firm* — IP Law Leaders, PLLC

(57) ABSTRACT

A glass unit includes an energy collecting layer attached to a light directing device for collecting a light energy from the light directing device, and an energy converting layer electrically coupled to the energy collecting layer for converting the light energy into an electric energy, and the light directing device includes a number of nanometer particles to direct the light energy toward the energy collecting layer. The light directing device includes one or more glass layers, and a light collecting panel attached to the glass layer with a bonding layer and made of polymer materials which are mixed with the nanometer particles to form the light collecting panel.

16 Claims, 4 Drawing Sheets

GLASS UNIT

CROSS-REFERENCE TO RELATED APPLICATION

This application is a continuation of U.S. patent application Ser. No. 13/494,032 filed Jun. 12, 2012, which is a continuation-in-part of U.S. patent application Ser. No. 12/456,529 filed Jun. 17, 2009. This application claims the benefits of U.S. patent application Ser. No. 12/456,529 filed Jun. 17, 2009 and U.S. patent application Ser. No. 13/494,032 filed Jun. 12, 2012, and is incorporated herein by reference in their entireties.

BACKGROUND OF THE INVENTION

1. Field of the Invention

The present invention relates to a glass unit, and more particularly to a glass unit including an energy collecting structure for collecting the solar or light energy and for converting the solar or light energy into the electric energy and for storing the electric energy and for providing the electric energy to energize various electric facilities of families, schools, plants, or the like.

2. Description of the Prior Art

Typical glass units, safety glasses, or glass laminates comprise two or more glass laminates or layers and one or more adhesive or bonding layers disposed or engaged between the glass layers for solidly securing or bonding the glass layers together and for increasing the strength of the typical glass units, safety glasses, or glass laminates.

For example, U.S. Pat. No. 5,622,580 to Mannheim discloses one of the typical shatterproof glass laminates comprising at least one heat tempered or heat strengthened glass layer, at least one internal combination elastic shock absorbing adhesive plastic layer of polyvinyl butyral material, and at least one antilacerative plastic layer of polyester or polycarbonate material, and/or a polyester material having a scratch-resistant or self healing coating engaged therein.

However, the typical shatterproof glass laminates may only be used to keep out the wind and rain, and to shelter or obstruct from the sun shine, but may not be used to collect the solar or light energy.

The present invention has arisen to mitigate and/or obviate the afore-described disadvantages of the conventional glass units, safety glasses, or glass laminates.

SUMMARY OF THE INVENTION

The primary objective of the present invention is to provide a glass unit including an energy collecting structure for collecting the solar or light energy and for converting the solar or light energy into the electric energy and for storing the electric energy and for providing the electric energy to energize various electric facilities of families, schools, plants, or the like.

In accordance with one aspect of the invention, there is provided a glass unit comprising a light directing assembly, an energy collecting layer attached to the light directing assembly for collecting a light energy from the light directing assembly, and an energy converting layer electrically coupled to the energy collecting layer for receiving the light energy from the energy collecting layer and for converting the light energy into an electric energy, and the light directing assembly includes a number of nanometer particles to direct the light energy toward the energy collecting layer and to allow the light energy to be suitably or effectively collected by the energy collecting layer.

The light directing assembly includes at least one glass layer, and a light collecting panel attached to the glass layer and made of polymer materials which are mixed with the nanometer particles to form the light collecting panel. The light collecting panel is attached and secured to the glass layer with an adhesive or bonding layer, in which the bonding layer includes a number of nanometer particles provided therein for directing the light energy toward the energy collecting layer.

The light directing assembly includes a light reflecting panel attached to the light collecting panel for reflecting the light back to the light collecting panel. The light reflecting panel is attached and secured to the light collecting panel with an adhesive or bonding layer. The bonding layer includes a number of nanometer particles provided therein for directing the light energy toward the energy collecting layer.

The light reflecting panel is made of polymer materials selected from a polyethylene terephtalate (PET), a modified polyethylene terephtalate (PETG), and an acrylonitrile butadiene styrene (ABS). The nanometer particles are preferably made of ITO, E-Cr, Mo, i-ZnO, ZnO/Al2O3, CuCa, etc.

The light directing assembly includes an inner glass layer attached and secured to the light reflecting panel with an adhesive or bonding layer. The bonding layer includes a number of nanometer particles provided therein for directing the light energy toward the energy collecting layer.

An energy reservoir may further be provided and electrically coupled to the energy converting layer for receiving and storing the electric energy. The energy reservoir is selected from a lead-acid battery, an Ni-Mh battery, an Ni—Cd battery, an LiFePO4 battery, and an Li/MnO2 battery.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
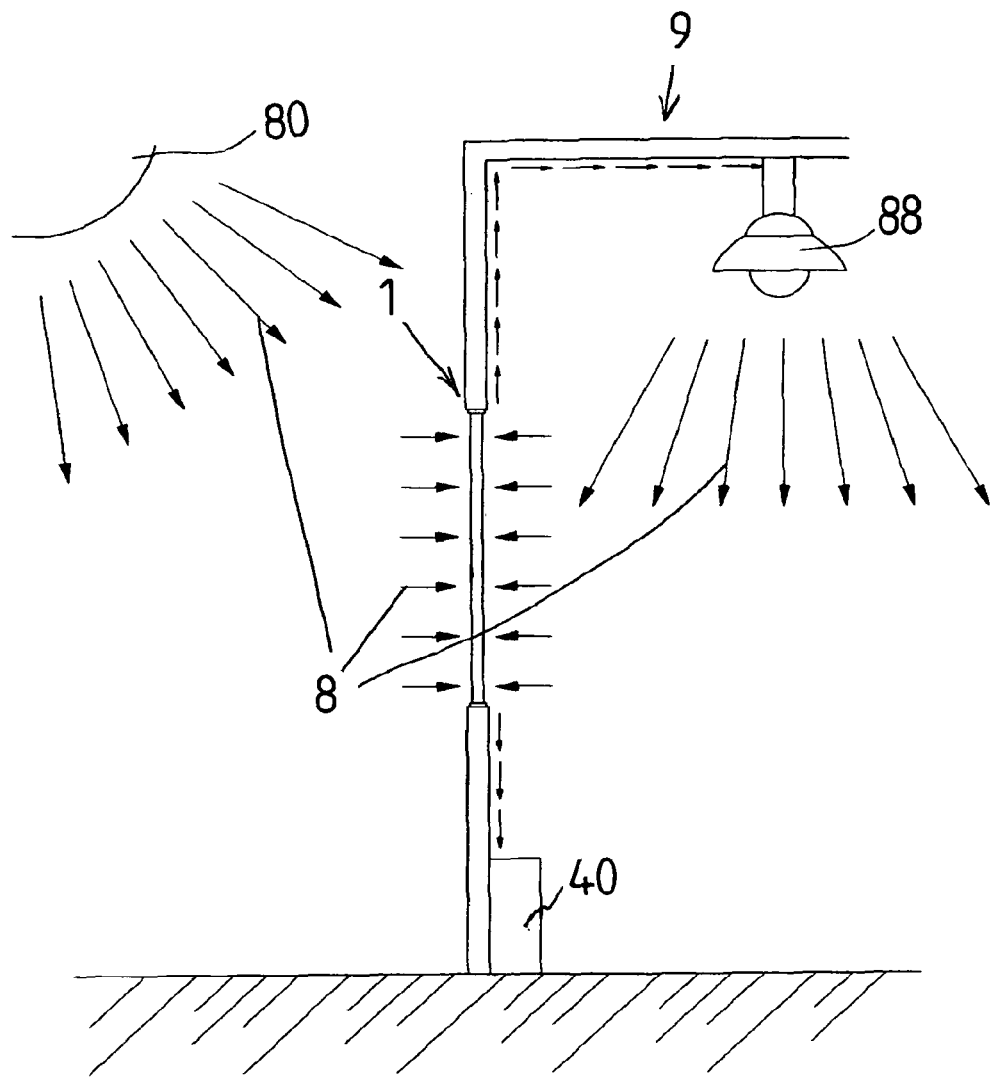
FIG. 1 is a plan schematic view illustrating the operation of a glass unit in accordance with the present invention.

Referring to the drawings, and initially to FIG. 1, a glass unit 1 in accordance with the present invention is provided for attaching or securing to various frames or houses or buildings 9 for collecting the solar or light energy from the light 8 of the sun 80, the light devices 88 or the like, and for converting the solar or light energy into the electric energy and for providing the electric energy to energize various electric devices or facilities 88 of families, schools, plants, or the like.

Figure 2:
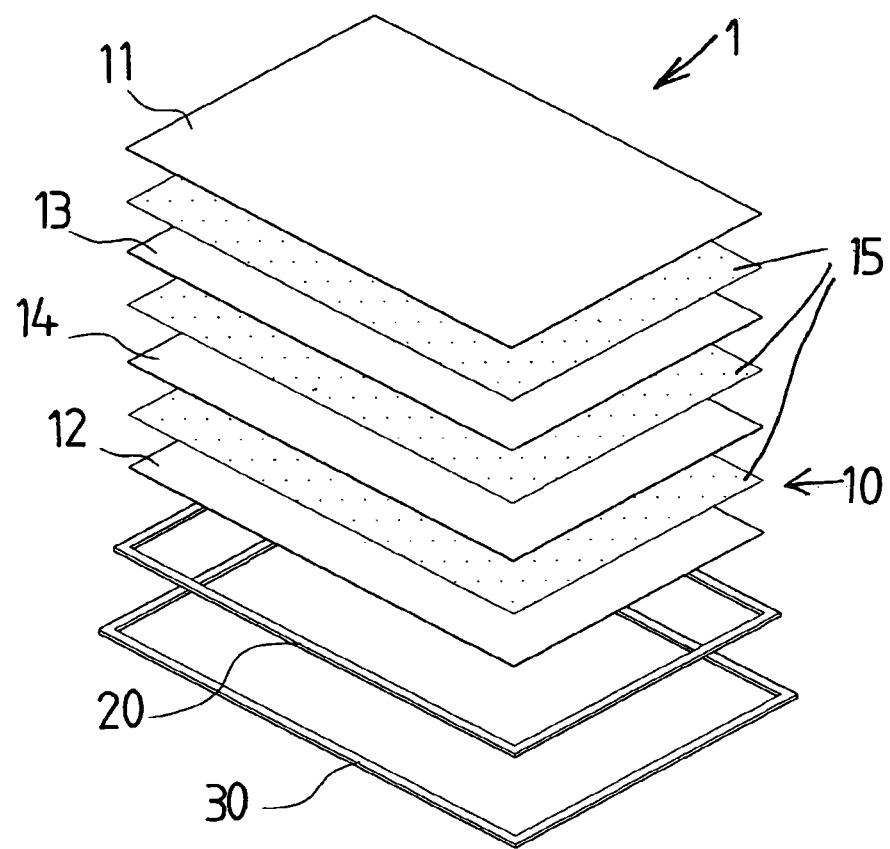
FIG. 2 is an exploded view of the glass unit.
Figure 3:
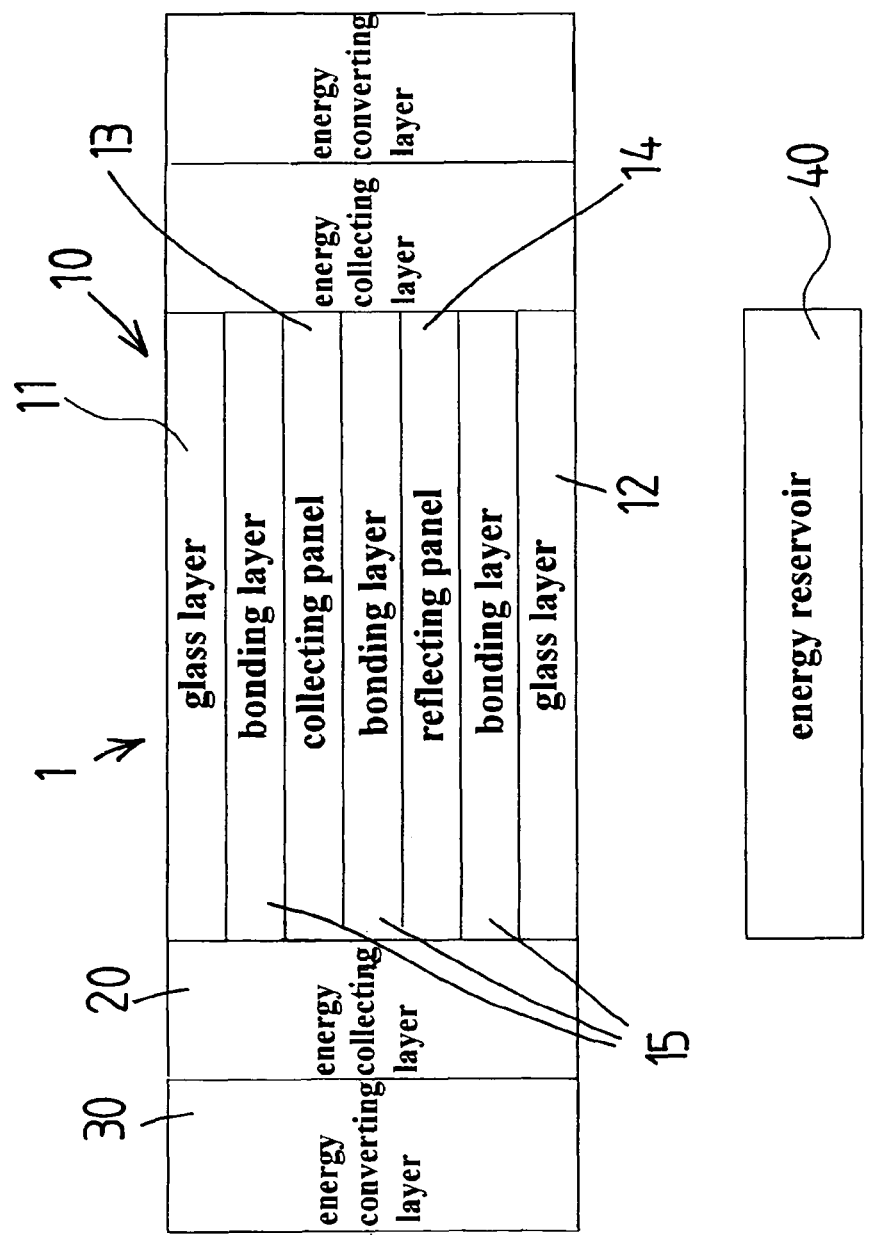
FIG. 3 is a block diagram illustrating the layers of the glass unit.

As shown in FIGS. 2 and 3, the glass unit 1 comprises a light transmitting or guiding or directing assembly 10 for transmitting or guiding or directing the light 8 from the sun 80, the light devices 88 or the like toward an energy collecting layer 20 which may be attached or secured or bonded to the light transmitting or guiding or directing assembly 10 or disposed beside the light transmitting or guiding or directing assembly 10 (FIGS. 3, 4), and which may be used to collect the solar or light energy.

An energy converting layer 30 may further be provided and engaged or attached or secured or bonded to the energy collecting layer 20, or disposed beside the energy collecting layer 20 (FIGS. 3, 4), and electrically coupled to the energy collecting layer 20 for receiving the solar or light energy from the energy collecting layer 20 and for converting the solar or light energy into the electric energy and for providing the electric energy to energize various electric facilities 88, such as the light devices 88 (FIGS. 1, 4) of families, schools, plants, or the like.

As shown in FIGS. 1 and 3, the glass unit 1 in accordance with the present invention may further comprise an electric energy storing system or energy reservoir 40 electrically coupled to the energy converting layer 30 for receiving and collecting or saving or storing the electric energy, and then for providing the electric energy to energize various electric facilities 88, such as the light devices 88 (FIGS. 1, 4) of families, schools, plants, or the like, in which the energy reservoir 40 may be selected from various power cells or batteries, such as the lead-acid Battery, Ni-Mh rechargeable battery, Ni—Cd rechargeable battery, LiFePO4 battery, Li/MnO2 battery, or the like.

Figure 4:
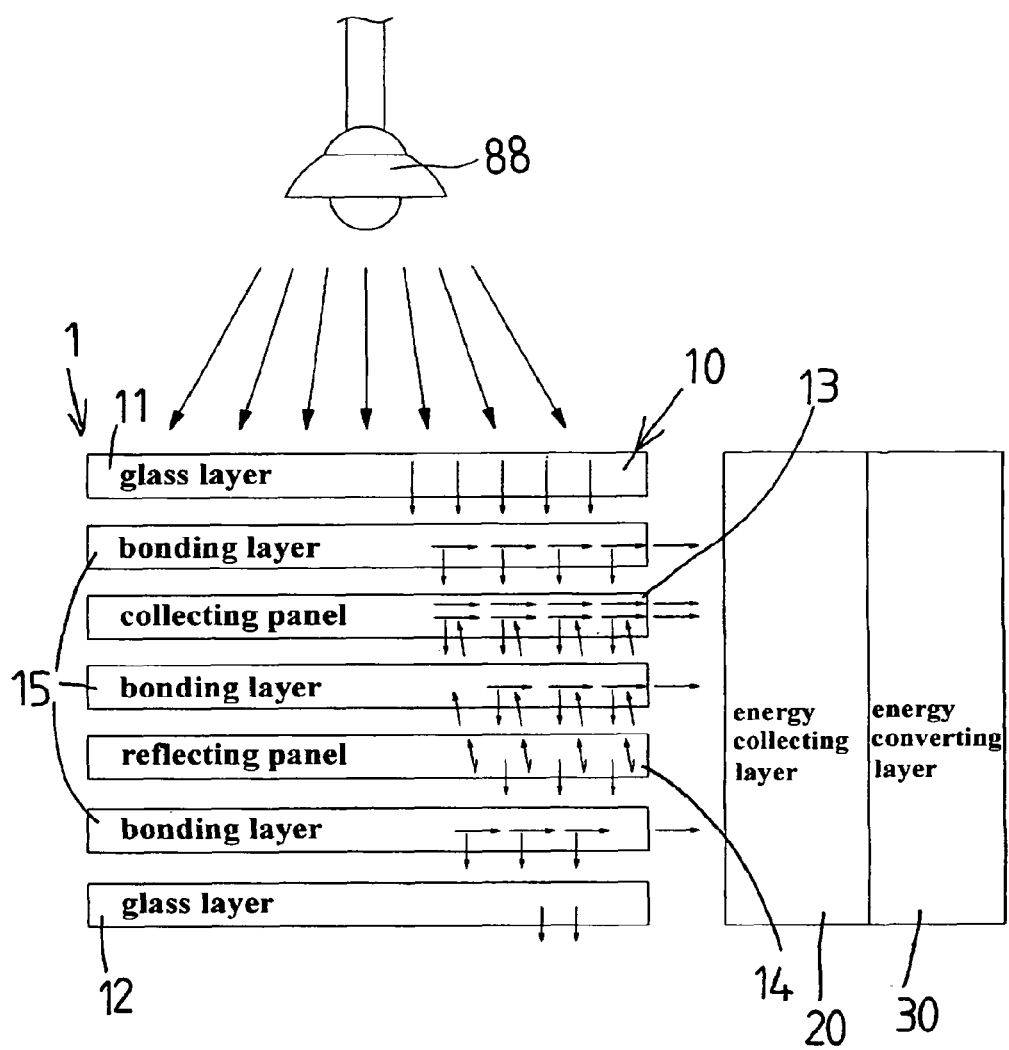
FIG. 4 is a plan schematic view similar to FIG. 1, illustrating the operation of the glass unit.

As shown in FIGS. 2-4, the light transmitting or guiding or directing assembly 10 includes one or more (such as two) glass layers 11, 12, such as an outer glass layer 11 and an inner glass layer 12, a light collecting film or panel 13 disposed or engaged between the glass layers 11, 12, a light refracting or reflecting film or panel 14 also disposed or engaged between the glass layers 11, 12, and particularly disposed or engaged between the inner glass layer 12 and the light collecting panel 13, and one or more adhesive or bonding membranes or layers 15 disposed or engaged between the glass layers 11, 12, and the light collecting panel 13 and the light reflecting panel 14 for solidly securing or bonding the glass layers 11, 12, and the light collecting panel 13 and the light reflecting panel 14 together and for forming the light transmitting or guiding or directing assembly 10.

The light collecting film or panel 13 is made of polymer materials or particles, such as the polystyrene (PS), polypropylene (PP), polycarbonate (PC), polymethyl methacrylate (AC), or acrylonitrile butadiene styrene (ABS), and a number of nanometer particles mixed with the polymer particles in the range between 0.01%-10%, and then molded or pressed or formed into the light collecting panel 13 which preferably includes a thickness in the range between 2 mm-12 mm for suitably collecting or directing the sun light or the other light. The nanometer particles are preferably made of ITO, E-Cr, Mo, i-ZnO, ZnO/Al2O3, CuCa, etc.

The light refracting or reflecting film or panel 14 is made of polymer materials, such as the polyethylene terephtalate (PET), modified polyethylene terephtalate (PETG), or acrylonitrile butadiene styrene (ABS), and includes a thickness in the range between 0.15 mm-0.3 mm, and a light refracting or reflecting membrane of such as Cu, Al, Ag, Ni, etc. is applied or sprayed or painted onto the polymer materials for refracting or reflecting the light back to the light collecting panel 13 and for allowing the sun light or the other light or the solar or light energy to be suitably or effectively collected or directed by the light collecting panel 13.

The adhesive or bonding membranes or layers 15 are provided for solidly securing or bonding the glass layers 11, 12, and the light collecting panel 13 and the light reflecting panel 14 together and for diverging the light 8, and the adhesive or bonding membranes or layers 15 may include a thickness in the range between 0.25 mm-1.0 mm, and a number of nanometer particles may further be provided and mixed with the adhesive or bonding membranes or layers 15 in the range between 0.01%-5%, for increasing the light diverging ability for up to 15%-45%.

In operation, as shown in FIG. 4, the light 8 from the sun 80, the light devices 88 or the like may be transmitted through the outer glass layer 11 of the light transmitting or guiding or directing assembly 10, and may also be transmitted through the first or the outer adhesive or bonding membrane or layer 15 and toward the light collecting panel 13 which may collect or direct the solar or light energy and may transmit or direct the sun light or the other light or the solar or light energy to the energy collecting layer 20 which may be used to collect the solar or light energy and which may transmit the solar or light energy to the energy converting layer 30 for allowing the solar or light energy to be converted into the electric energy and to be stored in the energy reservoir 40.

It is to be noted that the adhesive or bonding membranes or layers 15 may also be used to guide or collect or direct the sun light or the other light 8 or the solar or light energy toward the energy collecting layer 20 for allowing the sun light or the other light 8 or the solar or light energy to be suitably or effectively collected by the energy collecting layer 20. Some of the light 8 may be transmitted through the energy collecting layer 20, and may mostly be refracted or reflected by the light reflecting panel 14 and then may further be collected by the energy collecting layer 20. Some of the light 8 may also be transmitted through the light reflecting panel 14 and then may be partially guided or directed toward the energy collecting layer 20. Only less light may be transmitted through the inner glass layer 12 of the light transmitting or guiding or directing assembly 10.

It is further to be noted that the typical glass units, safety glasses, or glass laminates may only be used to keep out the wind and rain, and to shelter or obstruct from the sun shine, but may not be used to collect the solar or light energy, such that most of the sun shine or the solar or light energy is wasted and may not be collected and used.

Accordingly, the glass unit in accordance with the present invention includes an energy collecting structure for collecting the solar or light energy and for converting the solar or light energy into the electric energy and for storing the electric energy and for providing the electric energy to energize various electric facilities of families, schools, plants, or the like.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:
1. A glass unit comprising:
a pair of glass layers;
first, second and third adhesive layers, each containing one plurality of nanometer particles, disposed between the pair of glass layers, for directing light energy received;
a light collecting layer containing an other plurality of nanometer particles, disposed between the first and second adhesive layers, for directing light energy received;

a light reflecting layer disposed between the second and third adhesive layers for reflecting light energy received back to the light collecting layer;

a transparent layer contacting the light collecting layer, the light reflecting layer, and the first, second and third adhesive layers, for collecting light energy received therefrom; and an energy converting layer contacting the transparent layer for converting the light energy received therefrom into electric energy, wherein the first adhesive layer directly contacts and bonds one of the pair of glass layers and the light collecting layer, the second adhesive layer directly contacts and bonds the light collecting layer and the light reflecting layer, and the third adhesive layer directly contacts and bonds the light reflecting layer and other one of the pair of glass layers.

2. The glass unit of claim 1, wherein the one and other pluralities of the nanometer particles are ITO, Mo, I-ZnO, ZnO/Al2O3 or CuCa.

3. The glass unit of claim 1, further comprising an energy reservoir coupled to the energy converting layer for storing and providing the converted electric energy.

4. The glass unit of claim 3, wherein the energy reservoir is a lead-acid battery, Ni-Mh battery, Ni—Cd battery, LiFePO4 battery or Li/MnO2 battery.

5. The glass unit of claim 1, wherein the light collecting layer further includes first polymer particles which are polyethylene (PS), polypropylene (PP), polycarbonate (PC), polymethyl methacrylate (AC), or acrylonitrile butadiene styrene (ABS).

6. The glass unit of claim 1, wherein the light collecting layer has a thickness of 2 mm to 12 mm.

7. The glass unit of claim 1, wherein the light reflecting layer is made of second polymer materials which are polyethylene terephtalate (PET), modified polyethylene terephtalate (PETG) or acrylonitrile butadiene styrene (ABS).

8. The glass unit of claim 1, wherein the light reflecting layer further includes a light reflecting membrane made from Cu, Al, Ag or Ni.

9. The glass unit of claim 1, wherein the reflecting layer has a thickness of 0.15 mm to 0.3 mm.

10. The glass unit of claim 1, wherein each of the first, second, and third adhesive layers has an adhesive membrane in the thickness of 0.25 mm to 1 mm.

11. An energy module comprising:
a pair of transparent laminates;
first, second and third adhesive films, each containing one plurality of nanometer particles, disposed between the pair of transparent laminates, for directing light energy received;

a light collecting panel containing an other plurality of nanometer particles, disposed between the first and second adhesive films, for directing light energy received;

a light reflecting panel disposed between the second and third adhesive films for reflecting light energy received back to the light collecting panel;

a transparent layer contacting the light collecting panel, the light reflecting panel, and the first, second and third adhesive films, for collecting light energy received therefrom;

an energy converting layer contacting the transparent layer for converting the light energy received therefrom into electric energy; and an energy reservoir coupled to the energy converting layer for storing and providing the converted electric energy, wherein the first adhesive film directly contacts and bonds one of the pair of transparent laminates and the light collecting panel, the second adhesive film directly contacts and bonds the light collecting panel and the light reflecting panel, and the third adhesive film directly contacts and bonds the light reflecting panel and other one of the pair of transparent laminates.

12. The energy module of claim 11, wherein the one and other pluralities of the nano particles are ITO, Mo, ZnO/Al2O3 or CuCa.

13. The energy module of claim 11, wherein the energy reservoir is a lead-acid battery, Ni-Mh battery, Ni—Cd battery, LiFePO4 battery or Li/MnO2 battery.

14. The energy module of claim 11, wherein the light collecting panel is made from first polymer particles, which are polyethylene (PS), polypropylene (PP), polycarbonate (PC), polymethyl methacrylate (AC) or acrylonitrile butadiene styrene (ABS), and has a thickness of 2 mm to 12 mm.

15. The energy module of claim 11, wherein the light reflecting panel has a thickness of 0.15 mm to 0.3 mm, is made from second polymer materials which are polyethylene terephtalate (PET), modified polyethylene terephtalate (PETG), or acrylonitrile butadiene styrene (ABS), and further includes a light reflecting membrane made from Cu, Al, Ag or Ni.

16. The energy module of claim 11, wherein each of the first, second, and third adhesive films has an adhesive membrane in the thickness of 0.25 mm to 1 mm.

\* \* \* \* \*